(12) United States Patent
Jeon

(10) Patent No.: US 9,947,892 B2
(45) Date of Patent: Apr. 17, 2018

(54) ORGANIC LIGHT-EMITTING DISPLAY APPARATUS INCLUDING PERIPHERAL PART OPENING PATTERNS AND METHOD OF MANUFACTURING THE SAME

(71) Applicant: SAMSUNG DISPLAY CO., LTD., Yongin-si, Gyeonggi-Do (KR)

(72) Inventor: Heechul Jeon, Yongin-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 106 days.

(21) Appl. No.: 14/834,614

(22) Filed: Aug. 25, 2015

(65) Prior Publication Data

US 2016/0164027 A1 Jun. 9, 2016

(30) Foreign Application Priority Data

Dec. 9, 2014 (KR) .................. 10-2014-0175879

(51) Int. Cl.
  *H01L 31/0203* (2014.01)
  *H01L 51/52* (2006.01)
  *H01L 51/56* (2006.01)
  *H01L 27/12* (2006.01)

(52) U.S. Cl.
  CPC ...... *H01L 51/5246* (2013.01); *H01L 51/5203* (2013.01); *H01L 27/1248* (2013.01); *H01L 51/56* (2013.01); *H01L 2251/566* (2013.01)

(58) Field of Classification Search
  CPC ............. H01L 51/5246; H01L 51/5203; H01L 51/525; H01L 51/5243; H01L 51/5256; H01L 27/1248

USPC ............................................ 257/40, 59, 433
See application file for complete search history.

(56) References Cited

U.S. PATENT DOCUMENTS

| 2007/0170854 | A1 | 7/2007 | Kwak | |
| 2007/0176550 | A1* | 8/2007 | Kwan | H01L 51/5246 313/512 |
| 2010/0258346 | A1* | 10/2010 | Chen | H01L 21/56 174/521 |
| 2011/0186869 | A1* | 8/2011 | Hong | H01L 51/52 257/88 |

(Continued)

FOREIGN PATENT DOCUMENTS

| KR | 10-2005-0116278 A | 12/2005 |
| KR | 10-0671638 B1 | 1/2007 |

(Continued)

*Primary Examiner* — Lex Malsawma
*Assistant Examiner* — Eric W Jones
(74) *Attorney, Agent, or Firm* — Lee & Morse, P.C.

(57) ABSTRACT

An organic light-emitting display apparatus, including a lower substrate having a peripheral area, which includes a first peripheral part and a second peripheral part, and a display area between the first peripheral part and the second peripheral part; an upper substrate on the lower substrate; a sealing member between the lower substrate and the upper substrate and on the lower substrate in the peripheral area; and a first material layer between the sealing member and the lower substrate and including a first opening pattern at the first peripheral part and a second opening pattern at the second peripheral part, the second opening pattern having a smaller size than the first opening pattern.

20 Claims, 14 Drawing Sheets

(56) References Cited

U.S. PATENT DOCUMENTS

| | | | |
|---|---|---|---|
| 2012/0056523 A1* | 3/2012 | Han | H01L 27/3276 313/243 |
| 2012/0064278 A1* | 3/2012 | Chen | H01L 51/5246 428/76 |
| 2012/0319574 A1* | 12/2012 | Kim | H01L 51/5246 313/512 |
| 2013/0048967 A1* | 2/2013 | Nishido | H05B 33/04 257/40 |

FOREIGN PATENT DOCUMENTS

| | | |
|---|---|---|
| KR | 10-2011-0051785 A | 5/2011 |
| KR | 10-2012-0139075 A | 12/2012 |

\* cited by examiner

ORGANIC LIGHT-EMITTING DISPLAY APPARATUS INCLUDING PERIPHERAL PART OPENING PATTERNS AND METHOD OF MANUFACTURING THE SAME

CROSS-REFERENCE TO RELATED APPLICATION

Korean Patent Application No. 10-2014-0175879, filed on Dec. 9, 2014, in the Korean Intellectual Property Office, and entitled: "Organic Light-Emitting Display Apparatus and Method of Manufacturing the Same," is incorporated by reference herein in its entirety.

BACKGROUND

1. Field

One or more exemplary embodiments relate to an organic light-emitting display apparatus and a method of manufacturing the same.

2. Description of the Related Art

Organic light-emitting display apparatuses may have high-quality characteristics such as wide view angle, good contrast, and quick response time.

SUMMARY

Embodiments may be realized by providing an organic light-emitting display apparatus, including a lower substrate having a peripheral area, which includes a first peripheral part and a second peripheral part, and a display area between the first peripheral part and the second peripheral part; an upper substrate on the lower substrate; a sealing member between the lower substrate and the upper substrate and on the lower substrate in the peripheral area; and a first material layer between the sealing member and the lower substrate and including a first opening pattern at the first peripheral part and a second opening pattern at the second peripheral part, the second opening pattern having a smaller size than the first opening pattern.

The organic light-emitting display apparatus may further include a second material layer having a first through-hole between the sealing member and the first material layer and at the first peripheral part; and a second through-hole at the second peripheral part, the second through-hole having a smaller size than the first through-hole.

The first through-hole may be in the first opening pattern, and the second through-hole may be in the second opening pattern.

A plurality of first through-holes may be in the first opening pattern, and a plurality of second through-holes may be in the second opening pattern.

The peripheral area may further include a third peripheral part and a fourth peripheral part outside the display area and connecting the first peripheral part and the second peripheral part, and the first material layer further may include a third opening pattern at the third peripheral part and a fourth opening pattern at the fourth peripheral part, the fourth opening pattern having a smaller size than the third opening pattern.

The second material layer may further include a third through-hole at the third peripheral part and a fourth through-hole at the fourth peripheral part, the fourth through-hole having a smaller size than the third through-hole.

The third through-hole may be in the third opening pattern, and the fourth through-hole may be in the fourth opening pattern.

A plurality of third through-holes may be in the third opening pattern, and a plurality of fourth through-holes may be in the fourth opening pattern.

The third opening pattern may be smaller than the first opening pattern and larger than the second opening pattern.

The organic light-emitting display apparatus may further include a barrier layer between the lower substrate and the first material layer. At least a portion of the barrier layer may be exposed through the first through-hole and the second through-hole.

The sealing member may directly contact the barrier layer through the first through-hole and the second through-hole.

The first material layer may include a metallic material, and the second material layer may include an organic or inorganic material.

Embodiments may be realized by providing an organic light-emitting display apparatus, including a lower substrate having a display area and a peripheral area around the display area; an upper substrate on the lower substrate; a sealing member between the lower substrate and the upper substrate and on the lower substrate in the peripheral area; a first material layer between the sealing member and the lower substrate and including an opening pattern; and a second material layer between the sealing member and the first material layer and including a plurality of through-holes in the opening pattern.

The opening pattern and the plurality of through-holes may be gradually smaller in a clockwise or counterclockwise direction along the peripheral area.

Embodiments may be realized by providing A method of manufacturing organic light-emitting display apparatus, the method including preparing a lower mother substrate having a plurality of panels, each panel having a peripheral area including a first peripheral part and a second peripheral part and a display area between the first peripheral part and the second peripheral part; forming a first material layer on the lower mother substrate; forming a first opening pattern in the first material layer at the first peripheral part and forming a second opening pattern in the first material layer at the second peripheral part such that the second opening pattern has a smaller size than the first opening pattern; forming a display unit including an organic light-emitting device (OLED) in the display area; forming a sealing member in the peripheral area, forming the sealing member including forming the sealing member at the first peripheral part and thereafter forming the sealing member at the second peripheral part; bonding the lower mother substrate and an upper mother substrate with the sealing member therebetween; and cutting the plurality of panels along a cutting line between the plurality of panels.

Forming the sealing member may include forming the sealing member in a clockwise or counterclockwise direction.

The method may further include forming a second material layer after forming the first material layer and before forming the sealing member. Forming the second material layer may include forming a first through-hole in the second material layer at the first peripheral part and forming a second through-hole in the second material layer at the second peripheral part such that the second through-hole has a smaller size then the first through-hole.

Forming the second material layer may include forming the first through-hole in the first opening pattern and forming the second through-hole in the second opening pattern.

A plurality of first through-holes may be formed in the first opening pattern, and a plurality of second through-holes may be formed in the second opening pattern.

The method may further include forming a barrier layer after preparing the lower mother substrate and before forming the first material layer. The sealing member may directly contact at least a portion of the barrier layer through the first through-hole and the second through-hole.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
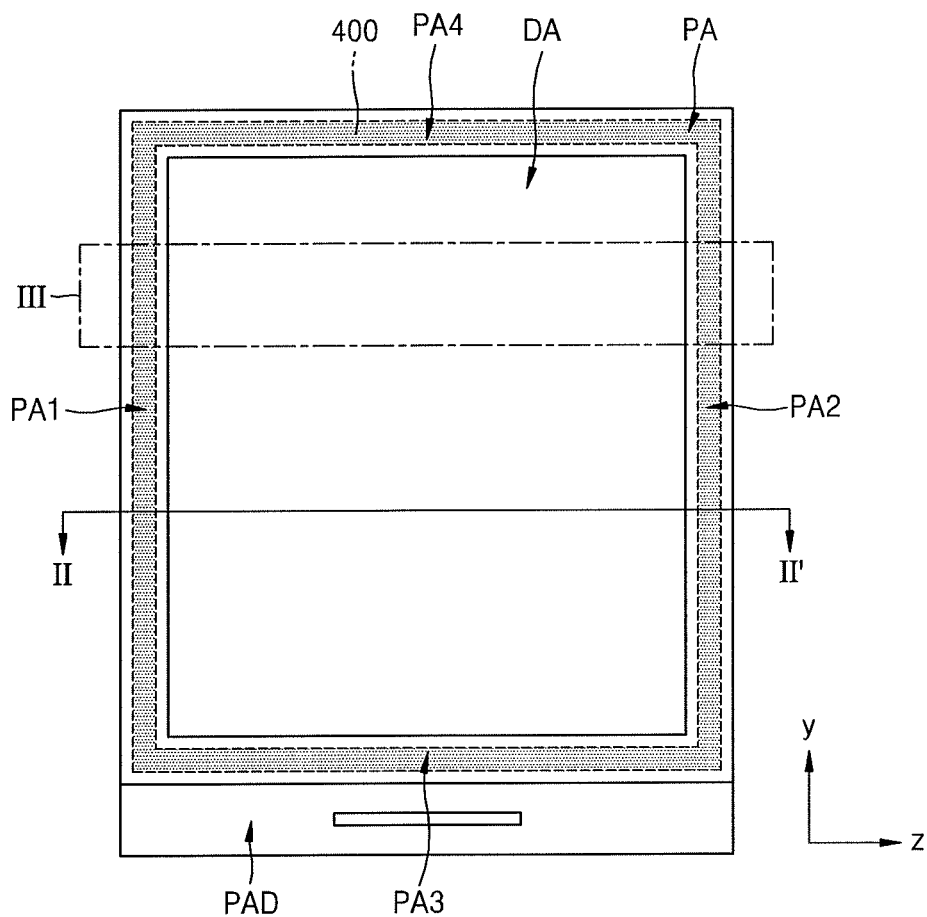
FIG. 1 illustrates a top view of an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description.

It will be understood that although the terms "first", "second", etc., may be used herein to describe various components, these components should not be limited by these terms. These components are only used to distinguish one component from another.

It will be further understood that the terms "comprises" and/or "comprising" used herein specify the presence of stated features or components, but do not preclude the presence or addition of one or more other features or components. It will be understood that when a layer, region, or component is referred to as being "formed on," another layer, region, or component, it can be directly or indirectly formed on the other layer, region, or component. That is, for example, intervening layers, regions, or components may be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

Figure 2:
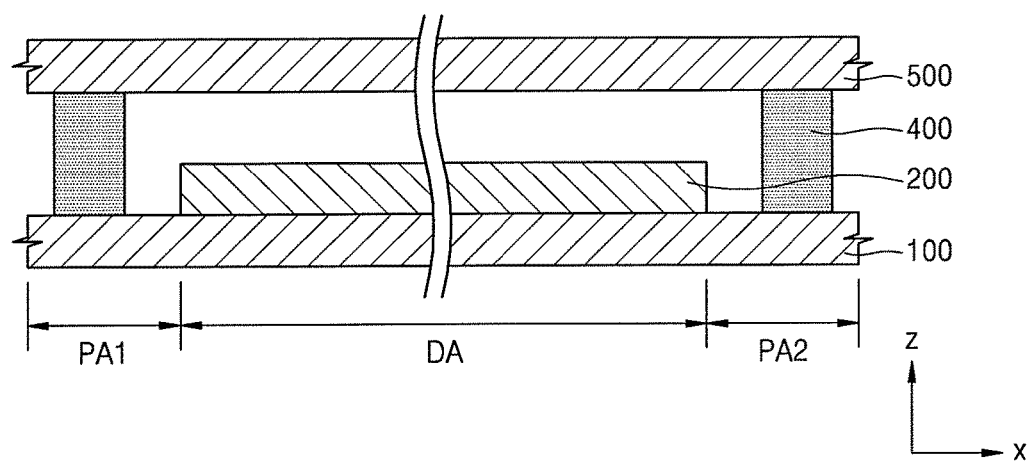
FIG. 2 illustrates a cross-sectional view of the organic light-emitting display apparatus of FIG. 1 along line II-II'.
Figure 3:
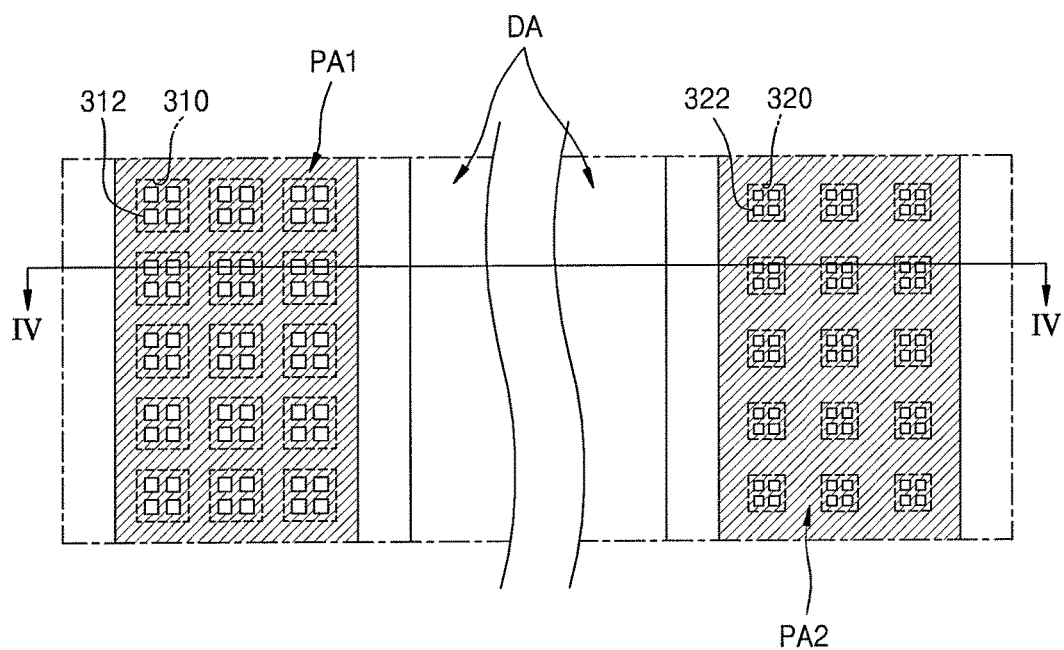
FIG. 3 illustrates a magnified top view of a portion where a sealing member is formed in a part III of FIG. 1.
Figure 4:
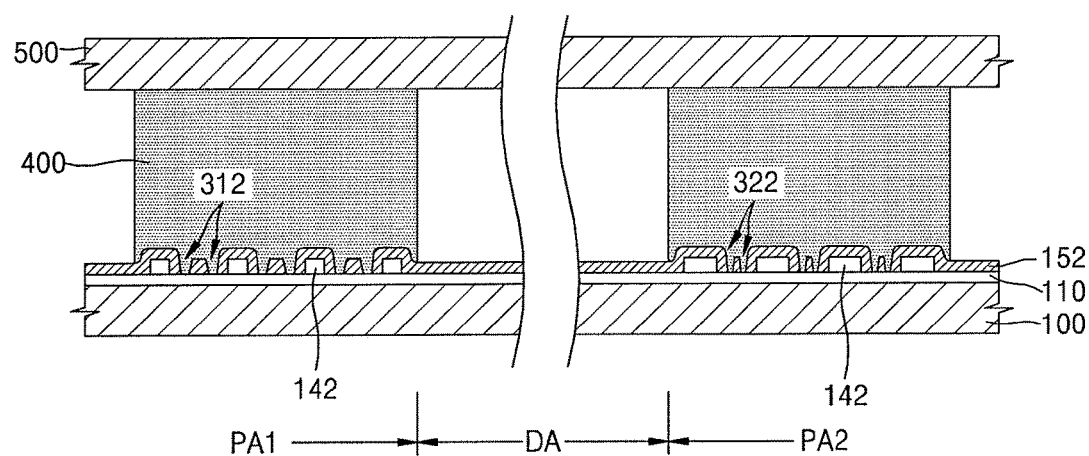
FIG. 4 illustrates a cross-sectional view of the organic light-emitting display apparatus of FIG. 3 along line IV-IV.

FIG. 1 illustrates a top view of an organic light-emitting display apparatus according to an embodiment, FIG. 2 illustrates a cross-sectional view of the organic light-emitting display apparatus of FIG. 1 along line II-II', FIG. 3 illustrates a magnified top view of a portion where a sealing member 400 is formed in the organic light-emitting display apparatus of FIG. 2, and FIG. 4 illustrates a cross-sectional view of a material layer formed below the sealing member 400 of the organic light-emitting display apparatus of FIG. 3.

Referring to FIGS. 1 to 4, the organic light-emitting display apparatus according to an embodiment may include a lower substrate 100, a first material layer 142 and a second material layer 152 disposed on the lower substrate 100 and partially patterned, a display unit 200, the sealing member 400, and an upper substrate 500.

Referring to FIGS. 1 and 2, the lower substrate 100 may have a display area DA in which a plurality of pixels may be arranged and a peripheral area PA surrounding the display area DA. The peripheral area PA of the lower substrate 100 may include a first peripheral part PA1, a second peripheral part PA2, a third peripheral part PA3, a fourth peripheral part PA4, and a pad part PAD. As shown in FIG. 1, the second peripheral part PA2 may be arranged symmetrically with the first peripheral part PA1, and the fourth peripheral part PA4 may be arranged symmetrically with the third peripheral part PA3. In an embodiment, for example, the first to fourth peripheral parts PA1 to PA4 may be arranged in a counter-clockwise direction in an order of the first peripheral part PA1, the third peripheral part PA3, the second peripheral part PA2, and the fourth peripheral part PA4. An arrangement relationship of the first to fourth peripheral parts PA1 to PA4 may be associated with an order of forming the sealing member 400 to be described in detail below.

The lower substrate 100 may be formed of a glass material, a metallic material, a plastic material such as, for example, polyethylene terephthalate (PET), polyethylene naphthalate (PEN), or polyimide, or other various materials.

The upper substrate 500 on the lower substrate 100 may also have the display area DA and the peripheral area PA as well as the lower substrate 100. The upper substrate 500 may be formed of, for example, a glass material, a metallic material, a plastic material such as PET, PEN, or polyimide, or other various materials as well as the lower substrate 100.

The sealing member 400 may be arranged between the lower substrate 100 and the upper substrate 500. The sealing member 400 may be arranged on the lower substrate 100 in the peripheral area PA. The upper substrate 500 may be bonded and sealed to the lower substrate 100 through the sealing member 400. For example, the sealing member 400 may be formed of, for example, frit or epoxy. The display unit 200 may be arranged in the display area DA and may include a plurality of pixels. For example, the display area DA may indicate an organic light-emitting display unit including a plurality of thin-film transistors and pixel electrodes connected to the plurality of thin-film transistors. A detailed structure of the display unit 200 will be described in detail below with reference to FIG. 4.

Referring to FIGS. 3 and 4, a barrier layer 110 may be disposed on the lower substrate 100. The barrier layer 110 may be a buffer layer for planarizing a surface of the lower substrate 100 or preventing infiltration of impurities into a semiconductor layer 120 of a thin-film transistor TFT (refer to FIG. 5). The barrier layer 110 may be formed of, for example, silicon oxide or silicon nitride.

The first material layer 142 may be disposed on the barrier layer 110. The first material layer 142 may be disposed in the same layer as a gate electrode 140 of the thin-film transistor TFT (refer to FIG. 5) in the display unit 200 and may be formed of a same material as the gate electrode 140. The first material layer 142 may include a metallic material, for example, may be formed of one or more of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu) and in a single layer or a multi-layer.

The barrier layer 110 and the first material layer 142 may be arranged all over the surface of the lower substrate 100, and first and second opening patterns 310 and 320 may be disposed in the first material layer 142 on the lower substrate 100 in the peripheral area PA. FIG. 3 shows an exemplary embodiment in which the first and second opening patterns 310 and 320 have a quadrilateral shape.

For example, the first material layer 142 located at the first peripheral part PA1 of the peripheral area PA may include the first opening pattern 310, and the first material layer 142 located at the second peripheral part PA2 of the peripheral area PA may include the second opening pattern 320. A size of the second opening pattern 320 may be smaller than a size of the first opening pattern 310. The first and second opening patterns 310 and 320 may be formed plural in number in the peripheral area PA. A portion of the barrier layer 110 disposed below the first material layer 142 may be exposed to the outside, for example, due to the first and second opening patterns 310 and 320. As used herein, size may refer to an area in plan view, as seen, for example, in FIG. 3, and/or may refer to a cross-sectional area, as seen, for example, in FIG. 4.

The size difference between the first and second opening patterns 310 and 320 may be determined by a forming order of the sealing member 400. For example, when the sealing member 400 at the first peripheral part PA1 at which the first opening pattern 310 is located is first formed, the size of the first opening pattern 310 may be larger than the size of the second opening pattern 320. The size of the first opening pattern 310 located at the first peripheral part PA1 at which the sealing member 400 is first formed may be formed larger, and the size of the second opening pattern 320 located at the second peripheral part PA2 at which the sealing member 400 is relatively later formed may be formed smaller.

It will be understood that this may be caused by a forming method in a process of manufacturing the sealing member 400. For example, the sealing member 400 may be formed in a clockwise or counterclockwise direction on the lower substrate 100 or below the upper substrate 500 in the peripheral area PA, wherein a portion where the sealing member 400 is first formed may be formed higher. A height difference between a start portion and an end portion of the sealing member 400 according to an order of forming the sealing member 400 may be adjusted by disposing the first opening pattern 310 at a portion where the sealing member 400 is first formed, i.e., at the first peripheral part PA1 in the present embodiment, when the sealing member 400 is formed.

The second material layer 152 may be disposed on the first material layer 142. The second material layer 152 may be disposed all over the surface of the lower substrate 100 as well as the first material layer 142. The second material layer 152 may extend to the display area DA and may be an interlayer insulating layer 150 (refer to FIG. 5) for electrically insulating the gate electrode 140 from a source electrode 160 (refer to FIG. 5) and a drain electrode 162 (refer to FIG. 5) of the thin-film transistor TFT. The second material layer 152 may be formed of an organic material and/or an inorganic material, e.g., silicon oxide or silicon nitride, and in a single layer or a multi-layer. The second material layer 152 formed on the lower substrate 100 in the peripheral area PA may include first and second through-holes 312 and 322. FIG. 3 shows an exemplary embodiment in which the first and second through-holes 312 and 322 have a quadrilateral shape.

For example, the second material layer 152 located at the first peripheral part PA1 of the peripheral area PA may include the first through-hole 312, and the second material layer 152 located at the second peripheral part PA2 of the peripheral area PA may include the second through-hole 322. A size of the second through-hole 322 may also be smaller than a size of the first through-hole 312, and the size of the second opening pattern 320 may be smaller than the size of the first opening pattern 310.

The first through-hole 312 may be located in the first opening pattern 310, and the second through-hole 322 may be located in the second opening pattern 320. A portion of the barrier layer 110 may be exposed through the first and second through-holes 312 and 322. The first and second through-holes 312 and 322 may each include a plurality of through-holes, wherein a plurality of first through-holes 312 may be formed in the first opening pattern 310, and a plurality of second through-holes 322 may be formed in the second opening pattern 320.

Through the first and second through-holes 312 and 322, a portion of the barrier layer 110 disposed below the first material layer 142 and the second material layer 152 may be exposed to the outside. For example, the second material layer 152 may be disposed to cover the first material layer 142. The second material layer 152 may be disposed to cover at least a portion of the first and second opening patterns 310 and 320 formed in the first material layer 142. For example, the second material layer 152 may have the first and second through-holes 312 and 322 in the first and second opening patterns 310 and 320, respectively, and a portion of the barrier layer 110 disposed below the first material layer 142 and the second material layer 152 may be exposed to the outside through the first and second through-holes 312 and 322.

The sealing member 400 may be disposed on the second material layer 152 such that the sealing member 400 fills in the first and second through-holes 312 and 322. The surface areas of the first and second through-holes 312 and 322 disposed in the first and second opening patterns 310 and 320 may increase in a depth direction so that the sealing member 400 is stably attached to the lower substrate 100. The sealing member 400 may directly contact the barrier layer 110 through the first and second through-holes 312 and 322.

As described above, the organic light-emitting display apparatus according to an embodiment may have a structure in which the first material layer 142 disposed at the first peripheral part PA1 may have the first opening pattern 310 and the second material layer 152 disposed on the first material layer 142 may have one or more first through-holes 312 in the first opening pattern 310. It may be understood with reference to FIG. 3 that a structure having one or more first through-holes 312 in the first opening pattern 310 may have a one-box structure.

The organic light-emitting display apparatus according to an embodiment may have a structure in which the first material layer 142 disposed at the second peripheral part PA2 arranged symmetrically with the first peripheral part PA1 may have the second opening pattern 320 and the second material layer 152 disposed on the first material layer 142 may have one or more second through-holes 322 in the second opening pattern 320. The size of the second opening pattern 320 may be smaller than the size of the first opening pattern 310, and likewise, the size of the second through-hole 322 may be smaller than the size of the first through-hole 312.

The first peripheral part PA1 and the second peripheral part PA2 may be symmetrically arranged based on the display area DA in terms of one display panel, and the second peripheral part PA2 of one display panel may be adjacent to the first peripheral part PA1 of another display panel which may share a long side with the one display panel in a manufacturing process. When the sealing member 400 is formed in the one display panel in one direction, a height difference may occur between a start portion and an end portion of the sealing member 400, and a stress according to formation and contraction of the sealing member 400 may occur between the lower substrate 100 and the upper substrate 500 of adjacent display panels. In the organic light-emitting display apparatus according to an embodiment, the sizes of the first opening pattern 310 and the first through-hole 312 disposed at the first peripheral part PA1 may be larger than the sizes of the second opening pattern 320 and the second through-hole 322 disposed at the second peripheral part PA2. When the sealing member 400 is formed in a counterclockwise direction by starting from the first peripheral part PA1, a height of the sealing member 400 may be high at the first peripheral part PA1 where the sealing member 400 is first formed and contracted, and a stress of the lower substrate 100 and the upper substrate 500, for example, due to a height difference of the sealing member 400 between adjacent display panels, may be minimized by forming the sizes of the first opening pattern 310 and the first through-hole 312 disposed at the first peripheral part PA1 to be larger than the sizes of the second opening pattern 320 and the second through-hole 322 disposed at the second peripheral part PA2.

As shown in FIG. 1, the peripheral area PA of the lower substrate 100 may further include the third peripheral part PA3 and the fourth peripheral part PA4 connecting the first peripheral part PA1 and the second peripheral part PA2. It may be understood that the first to fourth peripheral parts PA1 to PA4 may be arranged along and correspond to the sides of the peripheral area PA of the lower substrate 100 formed in an almost rectangular shape. The first peripheral part PA1 may be arranged symmetrically with the second peripheral part PA2, and the third peripheral part PA3 may be arranged symmetrically with the fourth peripheral part PA4. For example, the first to fourth peripheral parts PA1 to PA4 may be arranged in a counterclockwise direction in an order of the first peripheral part PA1, the third peripheral part PA3, the second peripheral part PA2, and the fourth peripheral part PA4.

The barrier layer 110, the first material layer 142, and the second material layer 152 may also be disposed at the third peripheral part PA3 and the fourth peripheral part PA4. As described above, the first material layer 142 located at the third peripheral part PA3 may include a third opening pattern, and the first material layer 142 located at the fourth peripheral part PA4 may include a fourth opening pattern. A size of the fourth opening pattern may be smaller than a size of the third opening pattern. The third and fourth opening patterns may be formed plural in number in the peripheral area PA.

The second material layer 152 may also be disposed on the first material layer 142 at the third peripheral part PA3 and the fourth peripheral part PA4. The second material layer 152 located at the third peripheral part PA3 may include a third through-hole, and the second material layer 152 located at the fourth peripheral part PA4 may include a fourth through-hole. Likewise, a size of the fourth through-hole may be smaller than a size of the third through-hole.

As described above, the third through-hole may be located in the third opening pattern, and the fourth through-hole may be located in the fourth opening pattern, and a portion of the barrier layer 110 may be exposed through the third and fourth through-holes. The third and fourth through-holes may each include a plurality of through-holes. For example, a plurality of third through-holes may be formed in the third opening pattern, and a plurality of fourth through-holes may be formed in the fourth opening pattern.

Referring back to FIGS. 1 to 4, the first to fourth peripheral parts PA1 to PA4 may be arranged in a counterclockwise direction in an order of the first peripheral part PA1, the third peripheral part PA3, the second peripheral part PA2, and the fourth peripheral part PA4, and the sizes of the first opening pattern 310 and the first through-hole 312 disposed at the first peripheral part PA1 may be the largest, and pattern sizes may gradually decrease in a counterclockwise direction based on the first peripheral part PA1. For example, the size of the third opening pattern disposed at the third peripheral part PA3 may be smaller than the size of the first opening pattern 310 disposed at the first peripheral part PA1 and may be larger than the size of the second opening pattern 320 disposed at the second peripheral part PA2.

The sizes of the first opening pattern 310 and the first through-hole 312 disposed at the first peripheral part PA1, the third opening pattern and the third through-hole disposed at the first peripheral part PA3, the second opening pattern 320 and the second through-hole 322 disposed at the third peripheral part PA2, and the fourth opening pattern and the fourth through-hole disposed at the fourth peripheral part PA4 may gradually decrease. For example, the sizes of the first opening pattern 310 and the first through-hole 312 disposed at the first peripheral part PA1 may be the largest, and the sizes of the fourth opening pattern and the fourth through-hole may be the smallest.

In the present embodiment, the first to fourth peripheral parts PA1 to PA4 may be arranged in a counterclockwise direction in an order of the first peripheral part PA1, the third peripheral part PA3, the second peripheral part PA2, and the fourth peripheral part PA4. In an embodiment, the first to fourth peripheral parts PA1 to PA4 may be arranged clockwise in an order of the first peripheral part PA1, the third peripheral part PA3, the second peripheral part PA2, and the fourth peripheral part PA4. The sizes of the first opening pattern 310 and the first through-hole 312 disposed at the first peripheral part PA1 may be the largest, and pattern sizes may gradually decrease in a clockwise direction based on the first peripheral part PA1. Referring to FIG. 4, the sealing member 400 may be disposed on the lower substrate 100 in the peripheral area PA. The sealing member 400 may be formed of, for example, fit or epoxy. FIG. 4 shows that the sealing member 400 may be disposed on the second material layer 152. In an embodiment, another material layer may be disposed between the second material layer 152 and the sealing member 400.

The sealing member 400 may be interposed between the lower substrate 100 and the upper substrate 500. By the sealing member 400, the lower substrate 100 and the upper substrate 500 may be bonded, and the display unit disposed on the lower substrate 100 in the display area DA may be sealed and protected from the outside. To firmly bond the upper substrate 500 and the lower substrate 100 by means of the sealing member 400, the first opening pattern 310, the third opening pattern, the second opening pattern 320, and the fourth opening pattern may be arranged in the first material layer 142 disposed on the lower substrate 100 in the peripheral area PA, and the first through-hole 312, the third through-hole, the second through-hole 322, and the fourth through-hole may be arranged in the second material layer 152 disposed on the lower substrate 100 in the peripheral area PA. A contact area between the lower substrate 100 and the sealing member 400 may be wide, for example, due to these opening patterns and through-holes, and a bonding force between the lower substrate 100 and the sealing member 400 may be improved.

A method of forming the sealing member 400 will be described in detail when a manufacturing method is described below, wherein when a process of forming the sealing member 400 on a mother substrate and cutting each panel is performed, a formed height of the sealing member 400 and a contraction rate of the sealing member 400 in laser annealing vary according to an order of forming the sealing member 400. A stress may occur for each adjacent panel in the mother substrate and may cause a bad edge at a cut part during a cutting process, and a higher defect rate for a model having a narrower cutting zone may be caused.

According to an embodiment, a stress caused by a height difference when the sealing member 400 is formed may be minimized by forming opening patterns and through-holes below the sealing member 400 to increase an adhesive force between the sealing member 400 and the lower substrate 100 such that the opening patterns and through-holes may have different sizes for each part. For example, the sealing member 400 may be formed in a clockwise or counterclockwise direction along the peripheral area PA with a gradually lowered height such that a start portion of the sealing member 400 may have the highest height and an end portion thereof may have the lowest height. According to an embodiment, the sealing member 400 may be formed on the lower substrate 100 in a direction from the first peripheral part PA1 to the second peripheral part PA2 such that the sizes of the first opening pattern 310 and the first through-hole 312 formed at the first peripheral part PA1 which is the start portion where the sealing member 400 is first formed are larger than the sizes of the second opening pattern 320 and the second through-hole 322 formed at the second peripheral part PA2. When the sealing member 400 is formed in a counterclockwise direction in an order of the first peripheral part PA1, the third peripheral part PA3, the second peripheral part PA2, and the fourth peripheral part PA4, the sizes of the first opening pattern 310 and the first through-hole 312 located at the first peripheral part PA1 may be the largest, and the sizes of the fourth opening pattern and the fourth through-hole located at the fourth peripheral part PA4 may be the smallest. This pattern may be the same for each panel, a stress between adjacent panels, for example, due to the sealing member 400, may be alleviated, and a bad edge when each panel is cut may be minimized.

Figure 5:
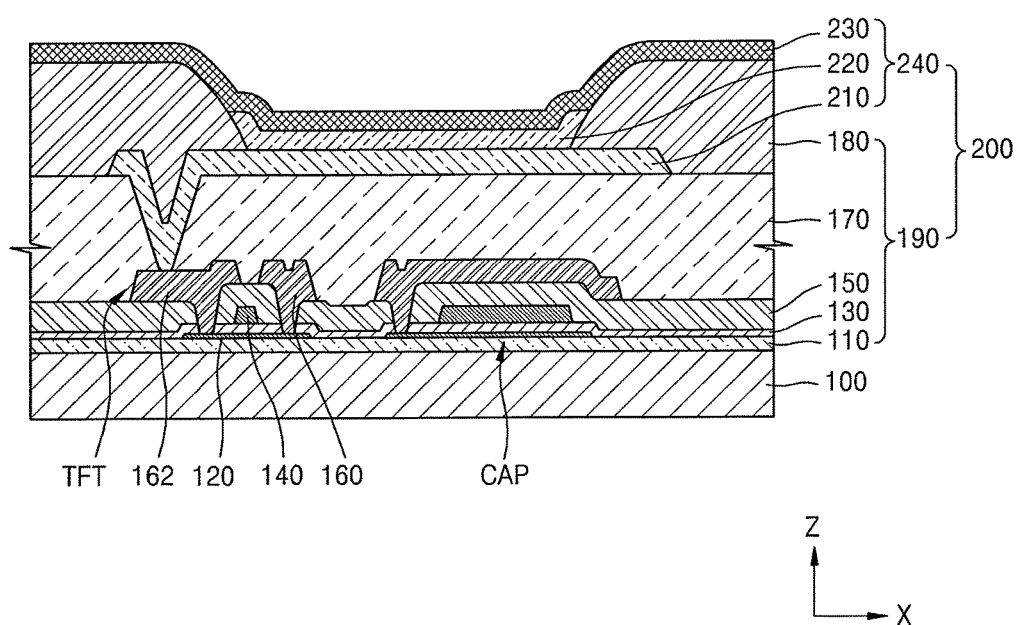
FIG. 5 illustrates a cross-sectional view of a display unit in a display area of the organic light-emitting display apparatus of FIG. 1.

FIG. 5 illustrates a cross-sectional view of the display unit 200 in the display area DA of the organic light-emitting display apparatus of FIG. 1.

Referring to FIG. 5, the organic light-emitting display apparatus according to an embodiment may include the lower substrate 100, a thin-film transistor layer 190, and an organic light-emitting device (OLED) 240. The display unit 200 may include the thin-film transistor layer 190 and the OLED 240. FIG. 5 shows an exemplary embodiment in which the OLED 240 may be disposed on the thin-film transistor layer 190. For bottom emission, the OLED 240 may be disposed directly on the lower substrate 100. In the present embodiment, for example, the display unit 200 may include the OLED 240. For example, the display unit 200 may be an organic light-emitting display unit including a plurality of thin-film transistors TFT and pixel electrodes connected to the plurality of TFTs.

The display unit 200 may be disposed on the lower substrate 100, wherein the thin-film transistor layer 190 may include a thin-film transistor TFT and a capacitor CAP, and the OLED 240 may be electrically connected to the thin-film transistor TFT. The thin-film transistor TFT may include the semiconductor layer 120 including amorphous silicon, polycrystalline silicon, or an organic semiconductor material, the gate electrode 140, the source electrode 160, and the drain electrode 162. A configuration of the thin-film transistor TFT will now be described in detail.

The barrier layer 110 formed of, for example, silicon oxide or silicon nitride, may be disposed on the lower substrate 100 to planarize a surface of the lower substrate 100 or to prevent infiltration, for example, of impurities, into the semiconductor layer 120 of the thin-film transistor TFT, and the semiconductor layer 120 may be disposed on the barrier layer 110. The barrier layer 110 may be understood as a buffer layer.

The gate electrode 140 may be disposed on the semiconductor layer 120, and according to a signal applied to the gate electrode 140, the source electrode 160 and the drain electrode 162 may be electrically connected. The gate electrode 140 may be formed of one or more of Al, Pt, Pd, Ag, Mg, Au, Ni, Nd, Ir, Cr, Li, Ca, Mo, Ti, W, or Cu and in a single layer or a multi-layer.

To help secure insulation between the semiconductor layer 120 and the gate electrode 140, a gate insulating layer 130 may be interposed between the semiconductor layer 120 and the gate electrode 140.

The interlayer insulating layer 150 may be disposed on the gate electrode 140 and may be formed of, for example, silicon oxide or silicon nitride, and in a single layer or a multi-layer.

The source electrode 160 and the drain electrode 162 may be disposed on the interlayer insulating layer 150. Each of the source electrode 160 and the drain electrode 162 may be electrically connected to the semiconductor layer 120 through a contact hole formed in the interlayer insulating layer 150 and the gate insulating layer 130. The source electrode 160 and the drain electrode 162 may be formed of one or more of, for example, Al, Pt, Pd, Ag, Mg, Au, Ni, Nd, Ir, Cr, Li, Ca, Mo, Ti, W, or Cu and in a single layer or a multi-layer in consideration of, for example, conductivity.

A protective layer covering the thin-film transistor TFT may be disposed to protect the thin-film transistor TFT having the structure described above. The protective layer may be formed of an inorganic material, e.g., silicon oxide, silicon nitride, or silicon oxynitride.

A first insulating layer 170 may be disposed on the lower substrate 100. The first insulating layer 170 may be a planarization layer or a protective layer. The first insulating layer 170 may planarize an upper surface of the thin-film transistor TFT and may protect the thin-film transistor TFT and various kinds of devices when the OLED is disposed on the thin-film transistor TFT. The first insulating layer 170 may be formed of, for example, an acrylic organic material or benzocyclobutene (BCB). As shown in FIG. 5, the barrier layer 110, the gate insulating layer 130, the interlayer insulating layer 150, and the first insulating layer 170 may be formed all over the lower substrate 100.

A second insulating layer 180 may be disposed on the thin-film transistor TFT. The second insulating layer 180 may be a pixel-defining layer. The second insulating layer 180 may be located on the first insulating layer 170 and may have an opening. The second insulating layer 180 may define a pixel area on the lower substrate 100.

The second insulating layer 180 may be, for example, an organic insulating layer. The organic insulating layer may include, for example, an acrylic polymer such as polymethylmethacrylate (PMMA), polymer derivatives having polystyrene (PS) and a phenol group, an imide-group polymer, an arylether-group polymer, an amide-group polymer, a fluorine-group polymer, a p-xylene-group polymer, a vinyl-alcohol-group polymer, or a mixture thereof.

The OLED 240 may be disposed on the second insulating layer 180. The OLED 240 may include a pixel electrode 210, an intermediate layer 220 including an emission layer (EML), and an opposite electrode 230.

The pixel electrode 210 may be a transparent (translucent) electrode or a reflective electrode. When the pixel electrode 210 is a transparent (translucent) electrode, the pixel electrode 210 may be formed of, for example, indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 210 is a reflective electrode, the pixel electrode 210 may include a reflective layer formed of, for example, Ag, Mg, Al, Pt, Pd, Au, Ni, Nd, Ir, Cr, or a composition thereof, and a layer formed of ITO, IZO, ZnO, $In_2O_3$, IGO, or AZO. In an embodiment, pixel electrode 210 may be formed of various materials and in a single layer or a multi-layer and may be variously modified.

The intermediate layer 220 may be disposed in the pixel area defined by the second insulating layer 180. The intermediate layer 220 include the EML and may further include, for example, a hole injection layer (HIL) and a hole transport layer (HTL) disposed between the EML and the pixel electrode 210, and an electron transport layer (ETL) and an electron injection layer (EIL) disposed between the EML and the opposite electrode 230, in a single structure or a multi-stack structure. In an embodiment, the intermediate layer 220 may have various structures.

The opposite electrode 230 which may cover the intermediate layer 220 including the EML and faces the pixel electrode 210 may be disposed all over the lower substrate 100. The opposite electrode 230 may be a transparent (translucent) electrode or a reflective electrode.

When the opposite electrode 230 is a transparent (translucent) electrode, the opposite electrode 230 may have a layer formed of a metal having a low work function, i.e., Li, Ca, lithium fluoride (LiF)/Ca, LiF/Al. Al, Ag, Mg, or a composition thereof and a transparent (translucent) conductive layer of, for example, ITO, IZO, ZnO, or $In_2O_3$. When the opposite electrode 230 is a reflective electrode, the opposite electrode 230 may have a layer formed of Li, Ca, LiF/Ca, LiF/Al, Al, Ag, Mg, or a composition thereof. In an embodiment, various modifications of the configuration and material of the opposite electrode 230 are possible.

An organic light-emitting display apparatus has been described. In an embodiment, provided is a method of manufacturing the organic light-emitting display apparatus.

Figure 6:
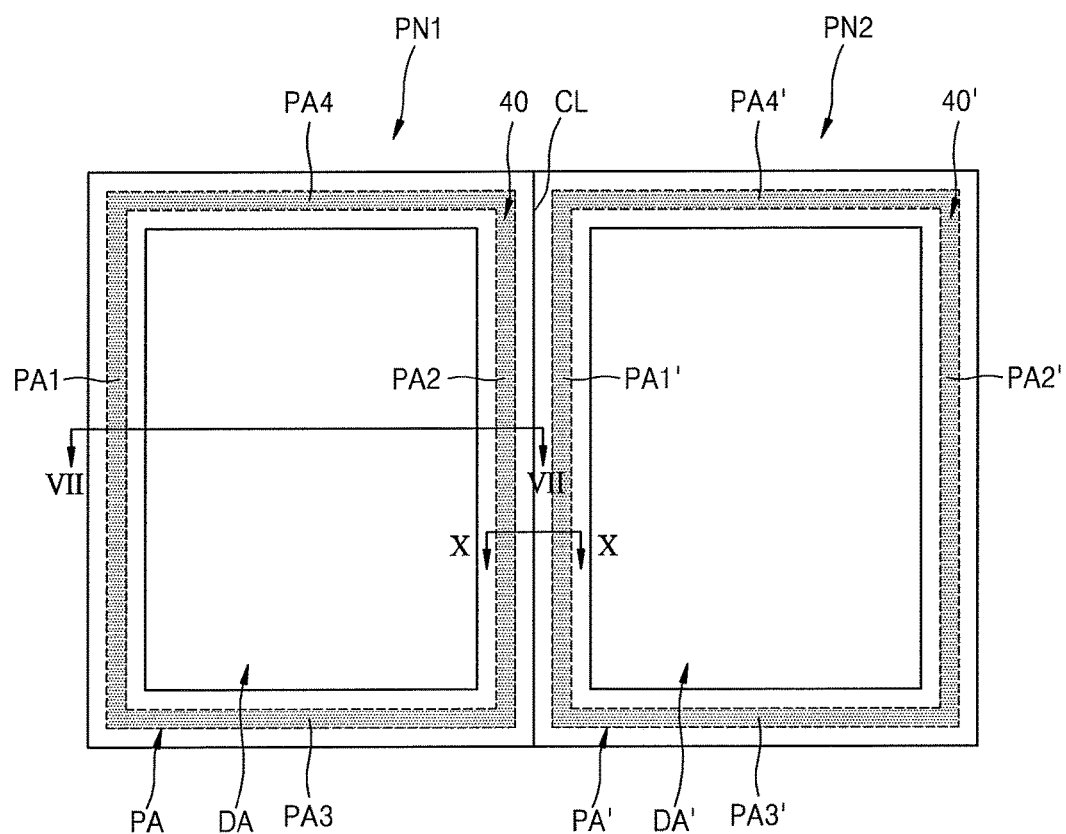
FIG. 6 illustrates a top view of two adjacent display panels in a method of manufacturing an organic light-emitting display apparatus, according to an embodiment.
Figure 7:
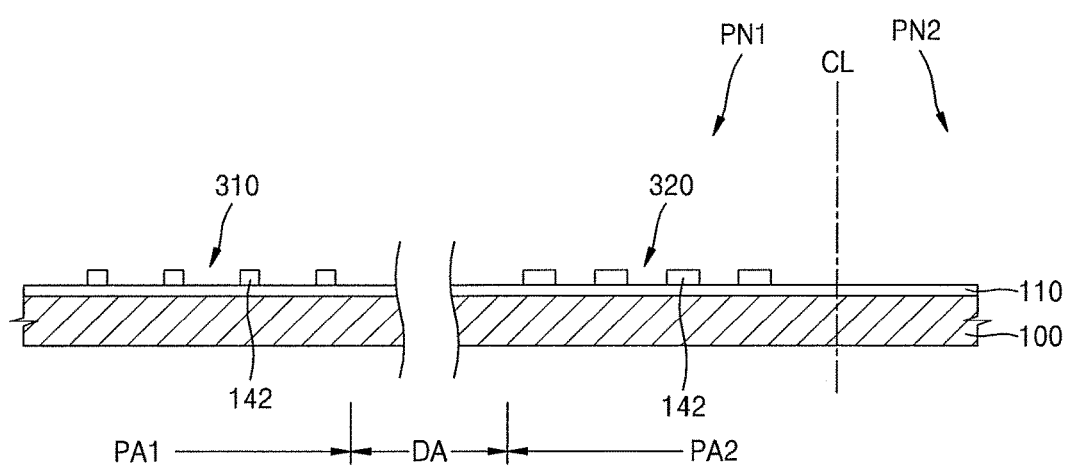
FIGS. 7 to 9 illustrate cross-sectional views of a process of manufacturing a region along line VII-VII of FIG. 6.
Figure 8:
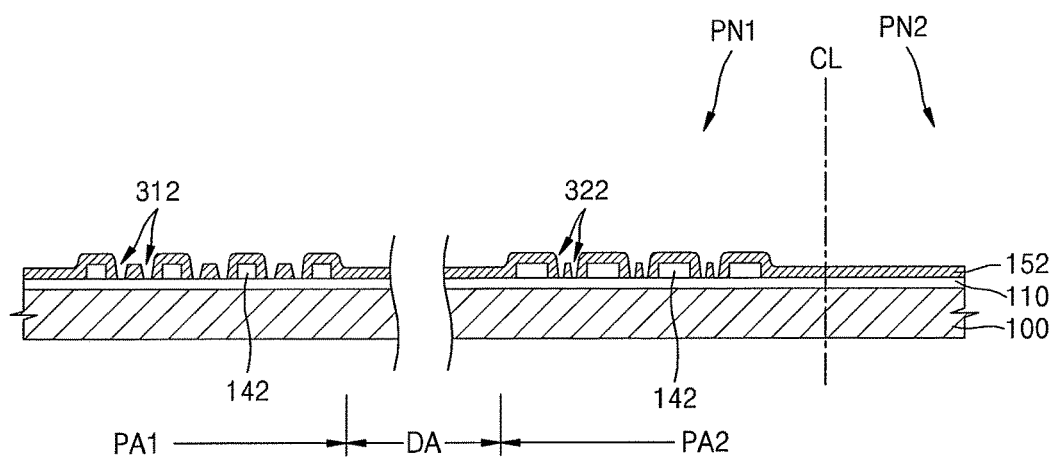
Figure 9:
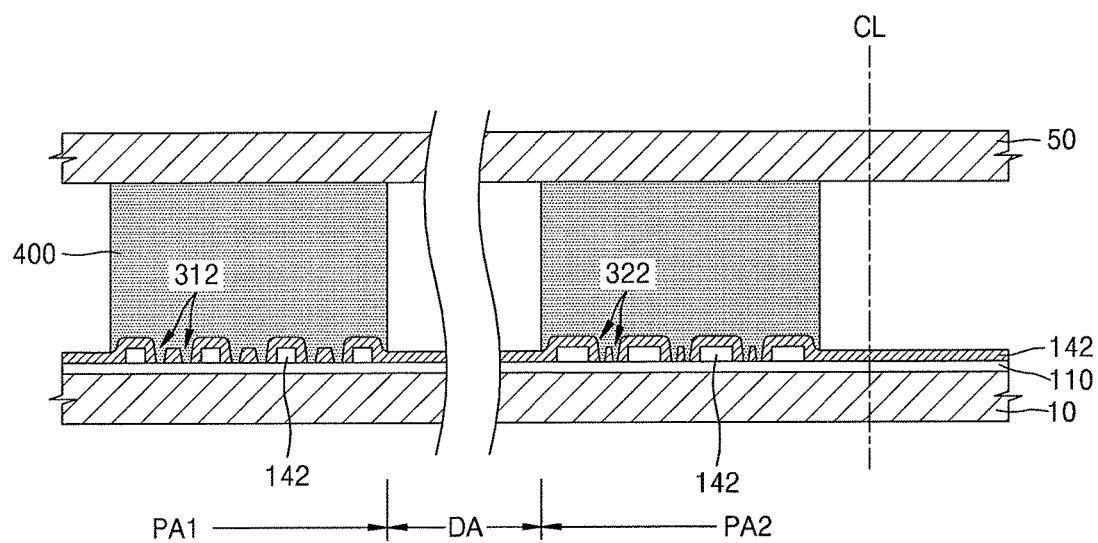
Figure 10:
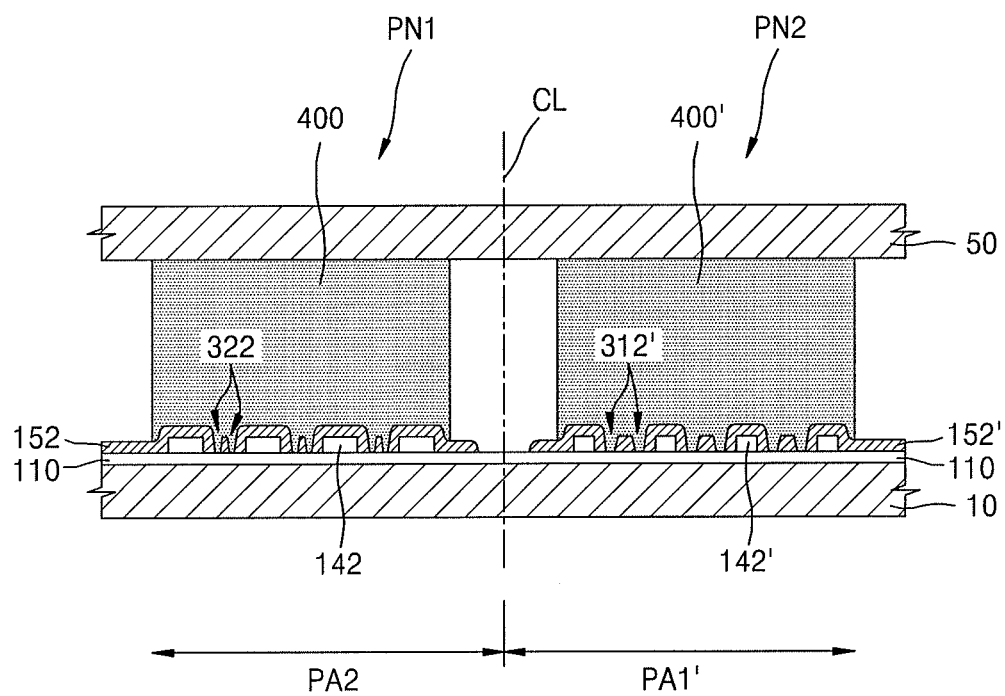
FIG. 10 illustrates a cross-sectional view of a process of manufacturing a region along line X-X of FIG. 6.

FIG. 6 illustrates a top view of two adjacent display panels in a method of manufacturing an organic light-emitting display apparatus, according to an embodiment, FIGS. 7 to 9 illustrate cross-sectional views of a process of manufacturing a region along line VII-VII of FIG. 6, and FIG. 10 illustrates a cross-sectional view of a process of manufacturing a region along line X-X of FIG. 6.

First, as shown in FIG. 6, a lower mother substrate 10 including a first panel PN1 and a second panel PN2 may be prepared. The first panel PN1 may have the peripheral area PA including the first peripheral part PA1, the second peripheral part PA2, the third peripheral part PA3, and the fourth peripheral part PA4 and the display area DA between the first peripheral part PA1 and the second peripheral part PA2, and the second panel PN2 may have a peripheral area PA' including a first peripheral part PA1', a second peripheral part PA2', a third peripheral part PA3', and a fourth peripheral part PA4' and a display area DA' between the first peripheral part PA1' and the second peripheral part PA2'.

In the first panel PN1, the second peripheral part PA2 may be formed symmetrically with the first peripheral part PA1, and the fourth peripheral part PA4 may be formed symmetrically with the third peripheral part PA3. For example, the first to fourth peripheral parts PA1 to PA4 may be arranged in a counterclockwise direction in an order of the first peripheral part PA1, the third peripheral part PA3, the second peripheral part PA2, and the fourth peripheral part PA4. This arrangement of the first to fourth peripheral parts PA1 to PA4 is only illustrative. An arrangement relationship of the first to fourth peripheral parts PA1 to PA4 may be associated with an order of forming the sealing member 400 to be described in detail below.

In the second panel PN2, the second peripheral part PA2' may be formed symmetrically with the first peripheral part PA1', and the fourth peripheral part PA4' may be formed symmetrically with the third peripheral part PA3'. For example, the first to fourth peripheral parts PA1' to PA4' may be arranged in a counterclockwise direction in an order of the first peripheral part PA1', the third peripheral part PA3', the second peripheral part PA2', and the fourth peripheral part PA4'.

The lower mother substrate 10 may be formed of a glass material, a metallic material, a plastic material such as, for example, PET, PEN, or polyimide, or other various materials. Only the first panel PN1 and the second panel PN2 are shown in the present embodiment for convenience of description. In an embodiment, a plurality of panels besides the first panel PN1 and the second panel PN2 may be formed on the lower mother substrate 10.

The second panel PN2 may be most adjacent to the first panel PN1 from the first panel PN1. The display panels formed on the lower mother substrate 10 may have an almost rectangular shape having long sides and short sides, wherein the first panel PN1 and the second panel PN2 share a long side. A cutting line CL may be formed at the long side which the first panel PN1 and the second panel PN2 share.

Each of the first panel PN1 and the second panel PN2 may have the display area DA or DA' at a center part thereof, wherein the display unit 200 may be formed in the display area DA or DA' and may include a plurality of pixels. For example, the display area DA or DA' may be an organic light-emitting display unit or a liquid crystal display unit including a plurality of thin-film transistors TFT and pixel electrodes connected to the plurality of thin-film transistors TFT. A detailed structure of the display unit 200 has been described above, and the description thereof is omitted.

FIGS. 7 to 10 illustrate cross-sectional views of a process of manufacturing an organic light-emitting display apparatus, according to an embodiment. Hereinafter, the manufacturing process will be described based on the first panel PN1, and a process of manufacturing the second panel PN2 may be the same as that for the first panel PN1, and the description below may also be applied to the process of manufacturing the second panel PN2.

First, referring to FIG. 7, after preparing the lower mother substrate 10, the first material layer 142 may be formed on the lower mother substrate 10. The first material layer 142 may be formed all over the lower mother substrate 10. According to circumstances, as shown in FIG. 7, the barrier layer 110 may be interposed between the lower mother substrate 10 and the first material layer 142. The barrier layer 110 may be formed on the lower mother substrate 10 and of, for example, silicon oxide or silicon nitride, to planarize a surface of the lower mother substrate 10 or to prevent infiltration, for example, of impurities, into upper layers.

Thereafter, the first material layer 142 formed on the lower mother substrate 10 may be patterned as shown in FIG. 7. The first material layer 142 may extend to the display area DA, and the first material layer 142 patterned in the display area DA may be understood as the gate electrode 140 of the thin-film transistor TFT (refer to FIG. 5). For example, the first material layer 142 may include a metallic material, e.g., may be formed of one or more of Al, Pt, Pd, Ag, Mg, Au, Ni, Nd, Ir, Cr, Li, Ca, Mo, Ti, W, or Cu and in a single layer or a multi-layer.

The first material layer 142 may be patterned as described above. The first material layer 142 patterned in the display area DA may be the gate electrode 140 of the thin-film transistor TFT, and the first material layer 142 patterned in the peripheral area PA may have the opening patterns 310 and 320. FIG. 3 illustrates an exemplary embodiment in which the opening patterns 310 and 320 may have a rectangular shape.

The first material layer 142 formed at the first peripheral part PA1 may be patterned to have the first opening pattern 310, and the first material layer 142 formed at the second peripheral part PA2 may be patterned to have the second opening pattern 320. The size of the second opening pattern 320 may be smaller than the size of the first opening pattern 310. The first and second opening patterns 310 and 320 may be formed plural in number in the peripheral area PA. A portion of the barrier layer 110 disposed below the first material layer 142 may be exposed to the outside through the first and second opening patterns 310 and 320.

As described above, a size difference between the first and second opening patterns 310 and 320 may be determined according to an order of forming the sealing member 400. For example, when the sealing member 400 is first formed at the first peripheral part PA1 where the first opening pattern 310 is located, the size of the first opening pattern 310 may be larger than the size of the second opening pattern 320. The size of the first opening pattern 310 located at the first peripheral part PA1 where the sealing member 400 is first formed may be relatively large, and the size of the second opening pattern 320 located at the second peripheral part PA2 where the sealing member 400 is formed later may be relatively small.

It may be understood that this may be caused by a method of forming the sealing member 400 in the process of manufacturing the organic light-emitting display apparatus. For example, the sealing member 400 may be formed in a clockwise or counterclockwise direction on the lower substrate 100 or below the upper substrate 500 in the peripheral area PA, wherein a portion where the sealing member 400 is first formed may be formed higher. A height difference between a start portion and an end portion of the sealing member 400 according to an order of forming the sealing member 400 may be adjusted by disposing the first opening pattern 310 at a portion where the sealing member 400 is first formed, i.e., at the first peripheral part PA1 in the present embodiment, when the sealing member 400 is formed.

As shown in FIG. 8, the second material layer 152 may be formed on the first material layer 142. The second material layer 152 may be formed all over the lower substrate 100 as well as the barrier layer 110 and the first material layer 142. The second material layer 152 may extend to the display area DA, and the second material layer 152 in the display area DA may be the interlayer insulating layer 150 (refer to FIG. 5) for electrically insulating the gate electrode 140 from the source electrode 160 and the drain electrode 162 of the thin-film transistor TFT (refer to FIG. 5). The second material layer 152 may be formed of an organic material and/or an inorganic material, e.g., silicon oxide or silicon nitride, and in a single layer or a multi-layer.

The second material layer 152 disposed on the lower substrate 100 in the peripheral area PA may be patterned to have the first and second through-holes 312 and 322. FIG. 3 illustrates an exemplary embodiment in which the first and second through-holes 312 and 322 may have a quadrilateral shape.

The second material layer 152 formed at the first peripheral part PA1 may be patterned to have the first through-hole 312, and the second material layer 152 formed at the second peripheral part PA2 may be patterned to have the second through-hole 322. The size of the second through-hole 322 may also be smaller than the size of the first through-hole 312, and size of the second opening pattern 320 may be smaller than the size of the first opening pattern 310.

The first through-hole 312 may be formed in the first opening pattern 310, and the second through-hole 322 may be formed in the second opening pattern 320. A portion of the barrier layer 110 may be exposed through the first and second through-holes 312 and 322. The first and second through-holes 312 and 322 may be formed plural in number, wherein a plurality of first through-holes 312 may be formed in the first opening pattern 310, and a plurality of second through-holes 322 may be formed in the second opening pattern 320.

The second material layer 152 may be formed to cover the first material layer 142. The second material layer 152 may be formed to cover the whole first material layer 142 and to cover only at least a portion of the first and second opening patterns 310 and 320 formed in the first material layer 142. Through the first and second through-holes 312 and 322, a portion of the barrier layer 110 disposed below the first material layer 142 and the second material layer 152 may be exposed to the outside. For example, the second material layer 152 may have the first and second through-holes 312 and 322 in the first and second opening patterns 310 and 320, respectively, and a portion of the barrier layer 110 disposed below the first material layer 142 and the second material layer 152 may be exposed to the outside through the first and second through-holes 312 and 322.

Referring to FIG. 9, the sealing member 400 may be formed on the second material layer 152 such that the sealing member 400 fills in the first and second through-holes 312 and 322. The sealing member 400 formed while filling in the first and second through-holes 312 and 322 may directly contact a portion of the barrier layer 110, which is exposed to the outside through the first and second through-holes 312 and 322. Surface areas of the first and second through-holes 312 and 322 disposed in the first and second opening patterns 310 and 320 may increase in a depth direction so that the sealing member 400 is stably attached to the lower mother substrate 10.

As described above, a structure in which the first opening pattern 310 may be formed in the first material layer 142 disposed at the first peripheral part PA1 and one or more first through-holes 312 may be formed in the first opening pattern 310 of the second material layer 152 disposed on the first material layer 142 may be provided. It may be understood with reference to FIG. 3 that a structure having one or more first through-holes 312 in the first opening pattern 310 may have a one-box structure.

A structure in which the second opening pattern 320 may be formed in the first material layer 142 disposed at the second peripheral part PA2 arranged symmetrically with the first peripheral part PA1 and one or more second through-holes 322 may be formed in the second opening pattern 320 of the second material layer 152 disposed on the first material layer 142 may be provided. Likewise, it may be understood with reference to FIG. 3 that a structure having one or more second through-holes 322 in the second opening pattern 320 may have a one-box structure. The size of the second opening pattern 320 may be smaller than the size of the first opening pattern 310, and likewise, the size of the second through-hole 322 may also be smaller than the size of the first through-hole 312.

The first peripheral part PA1 and the second peripheral part PA2 may be symmetrically arranged based on the display area DA in terms of the first panel PN1, and the second peripheral part PA2 of the first panel PN1 may be adjacent to the first peripheral part PA1' of the second panel PN2 which may share a long side with the first panel PN1 in a manufacturing process. When the sealing member 400 is formed in the first panel PN1 in one direction, a height difference may occur between a start portion and an end portion of the sealing member 400, and a stress according to formation and contraction of the sealing member 400 may occur between the lower mother substrate 10 and an upper mother substrate 50 of adjacent display panels.

In the present embodiment, the sizes of the first opening pattern 310 and the first through-hole 312 disposed at the first peripheral part PA1 of the first panel PN1 may be larger than the sizes of the second opening pattern 320 and the second through-hole 322 disposed at the second peripheral part PA2 of the first panel PN1. When the sealing member 400 is formed in a counterclockwise direction by starting from the first peripheral part PA1, a height of the sealing member 400 may be high at the first peripheral part PA1 where the sealing member 400 is first formed and contracted, and a stress of the lower mother substrate 10 and the upper mother substrate 50, for example, due to a height difference of the sealing member 400 between adjacent display panels, may be minimized by forming the sizes of the first opening pattern 310 and the first through-hole 312 disposed at the first peripheral part PA1 to be larger than the sizes of the second opening pattern 320 and the second through-hole 322 disposed at the second peripheral part PA2.

As shown in FIG. 6, the peripheral area PA of the first panel PN1 formed on the lower mother substrate 10 may further include the third peripheral part PA3 and the fourth peripheral part PA4 connecting the first peripheral part PA1 and the second peripheral part PA2. It may be understood that the first to fourth peripheral parts PA1 to PA4 may be arranged along and correspond to the sides of the peripheral area PA of the lower mother substrate 10 formed in an almost rectangular shape. The first peripheral part PA1 may be formed symmetrically with the second peripheral part PA2, and the third peripheral part PA3 may be formed symmetrically with the fourth peripheral part PA4. For example, the first to fourth peripheral parts PA1 to PA4 may be formed in a counterclockwise direction in an order of the first peripheral part PA1, the third peripheral part PA3, the second peripheral part PA2, and the fourth peripheral part PA4.

The barrier layer 110, the first material layer 142, and the second material layer 152 may also be formed at the third peripheral part PA3 and the fourth peripheral part PA4. As described above, the first material layer 142 located at the third peripheral part PA3 may include a third opening pattern, and the first material layer 142 located at the fourth peripheral part PA4 may include a fourth opening pattern. A size of the fourth opening pattern may be smaller than a size of the third opening pattern. The third and fourth opening patterns may be formed plural in number in the peripheral area PA.

The second material layer 152 may also be formed on the first material layer 142 at the third peripheral part PA3 and the fourth peripheral part PA4. The second material layer 152 located at the third peripheral part PA3 may include a third through-hole, and the second material layer 152 located at the fourth peripheral part PA4 may include a fourth through-hole. Likewise, a size of the fourth through-hole may be smaller than a size of the third through-hole.

As described above, the third through-hole may be formed in the third opening pattern, and the fourth through-hole may be located in the fourth opening pattern, and a portion of the barrier layer 110 may be exposed through the third and fourth through-holes. The third and fourth through-holes may each include a plurality of through-holes For example, a plurality of third through-holes may be formed in the third opening pattern, and a plurality of fourth through-holes may be formed in the fourth opening pattern.

Referring back to FIG. 6, the first to fourth peripheral parts PA1 to PA4 of the first panel PN1 may be arranged in a counterclockwise direction in an order of the first peripheral part PA1, the third peripheral part PA3, the second peripheral part PA2, and the fourth peripheral part PA4. The sizes of the first opening pattern 310 and the first through-hole 312 disposed at the first peripheral part PA1 may be the largest, and pattern sizes may gradually decrease in a counterclockwise direction based on the first peripheral part PA1. For example, the size of the third opening pattern disposed at the third peripheral part PA3 may be smaller than the size of the first opening pattern 310 disposed at the first peripheral part PA1 and may be larger than the size of the second opening pattern 320 disposed at the second peripheral part PA2.

The sizes of the first opening pattern 310 and the first through-hole 312 disposed at the first peripheral part PA1, the third opening pattern and the third through-hole disposed at the first peripheral part PA3, the second opening pattern 320 and the second through-hole 322 disposed at the third peripheral part PA2, and the fourth opening pattern and the fourth through-hole disposed at the fourth peripheral part PA4 may gradually decrease. For example, the sizes of the first opening pattern 310 and the first through-hole 312 disposed at the first peripheral part PA1 may be the largest, and the sizes of the fourth opening pattern and the fourth through-hole may be the smallest.

It has been described in the present embodiment that the first to fourth peripheral parts PA1 to PA4 may be arranged in a counterclockwise direction in an order of the first peripheral part PA1, the third peripheral part PA3, the second peripheral part PA2, and the fourth peripheral part PA4. In an embodiment, the first to fourth peripheral parts PA1 to PA4 may be arranged clockwise in an order of the first peripheral part PA1, the third peripheral part PA3, the second peripheral part PA2, and the fourth peripheral part PA4. The sizes of the first opening pattern 310 and the first through-hole 312 disposed at the first peripheral part PA1 may be the largest, and pattern sizes may gradually decrease in a clockwise direction based on the first peripheral part PA1.

Referring to FIG. 9, the sealing member 400 may be formed on the lower mother substrate 10 in the peripheral area PA. In an embodiment, the sealing member 400 may be formed of, for example, fit or epoxy. FIG. 9 shows that the sealing member 400 may be formed on the second material layer 152. In an embodiment, another material layer may be interposed between the second material layer 152 and the sealing member 400, and the sealing member may be formed on another material layer.

The sealing member 400 may be interposed between the lower mother substrate 10 and the upper mother substrate 50. For example, as an example of forming the sealing member 400, the sealing member 400 may be formed in a counterclockwise or clockwise direction below the upper mother substrate 50 at a location corresponding to the peripheral area PA. Thereafter, the upper mother substrate 50 below which the sealing member 400 may be formed may be bonded to the lower mother substrate 10 and annealed by a laser to seal between the upper mother substrate 50 and the lower mother substrate 10. This is an exemplary embodiment of forming the sealing member 400. In an embodiment, for example, the sealing member 400 may be formed directly on the lower mother substrate 10 in the peripheral area PA and bonded to the upper mother substrate 50. Through, for example, these method, by the sealing member 400, the lower mother substrate 10 and the upper mother substrate 50 may be bonded, and the display unit disposed on the lower mother substrate 10 in the display area DA may be sealed and protected from the outside.

To firmly bond the upper mother substrate 50 and the lower mother substrate 10 by means of the sealing member 400, the first opening pattern 310, the third opening pattern, the second opening pattern 320, and the fourth opening pattern may be formed in the first material layer 142 formed on the lower mother substrate 10 in the peripheral area PA, and the first through-hole 312, the third through-hole, the second through-hole 322, and the fourth through-hole may be formed in the second material layer 152 formed on the lower mother substrate 10 in the peripheral area PA. A contact area between the lower mother substrate 10 and the sealing member 400 may be wide, for example, due to these opening patterns and through-holes, and a bonding force between the lower mother substrate 10 and the sealing member 400 may be improved.

Thereafter, referring to FIG. 10, an operation of cutting along the cutting line CL between the first panel PN1 and the second panel PN2 formed by the method described above may be performed. When a process of forming the sealing member 400 on the lower mother substrate 10 and cutting each panel is performed, a formed height of the sealing member 400 and a contraction rate of the sealing member 400 in laser annealing vary according to an order of forming the sealing member 400. A stress may occur for each adjacent panel in the lower mother substrate 10 and may cause a bad edge at a cut part during a cutting process, and a higher defect rate for a model having a narrower cutting zone may be caused.

According to an embodiment, a stress caused by a height difference when the sealing member 400 is formed may be minimized by forming the first and second opening patterns 310 and 320 and the first and second through-holes 312 and 322 below the sealing member 400 to increase an adhesive force between the sealing member 400 and the lower mother substrate 10 such that the first and second opening patterns 310 and 320 and the first and second through-holes 312 and 322 may have different sizes for each part.

The sealing member 400 of the first panel PN1 may be formed in a clockwise or counterclockwise direction along the peripheral area PA of the first panel PN1 with a gradually lowered height such that a start portion of the sealing member 400 may have the highest height and an end portion thereof may have the lowest height. This may be the same for the second panel PN2 formed adjacently to the first panel PN1. The sealing member 400 may be formed in a counterclockwise direction based on the first peripheral part PA1 of the first panel PN1, and a sealing member 400' may also be formed in counterclockwise direction based on the first peripheral part PA1' of the second panel PN2. A stress may be applied to the lower mother substrate 10 and the upper mother substrate 50, for example, due to a height difference and an annealing contraction rate difference between the sealing member 400 formed at the second peripheral area PA2 of the first panel PN1 and the sealing member 400' formed at the first peripheral area PA1' of the second panel PN2, which may be formed adjacently to each other. This stress may cause cracks of the lower mother substrate 10 and the upper mother substrate 50 in a stressed direction during a cutting process, and a defect around the cutting line CL may result, and may occur more frequently for a model having a narrower width of the cutting line CL.

In the method of manufacturing an organic light-emitting display apparatus according to the present embodiment, the second opening pattern 320 and the second through-hole 322 may be formed at the second peripheral part PA2 where the sealing member 400 may be formed in the first panel PN1, and a first through-hole 312' larger than the second through-hole 322 may be formed at the first peripheral part PA1' where the sealing member 400' may be formed in the second panel PN2. The sealing member 400 may be firmly bonded to the lower mother substrate 10 by means of the first and second opening patterns 310 and 320 and the first and second through-holes 312 and 322 formed below the sealing member 400. A level difference, for example, due to a height and annealing contraction rate difference between the sealing member 400 of the first panel PN1 and the sealing member 400' of the second panel PN2, may be alleviated by means of the opening patterns 320 and 310' and the through-holes 322 and 312' having different sizes, and a defect rate in the cutting line CL during a cutting process may be dramatically reduced.

Figure 11:
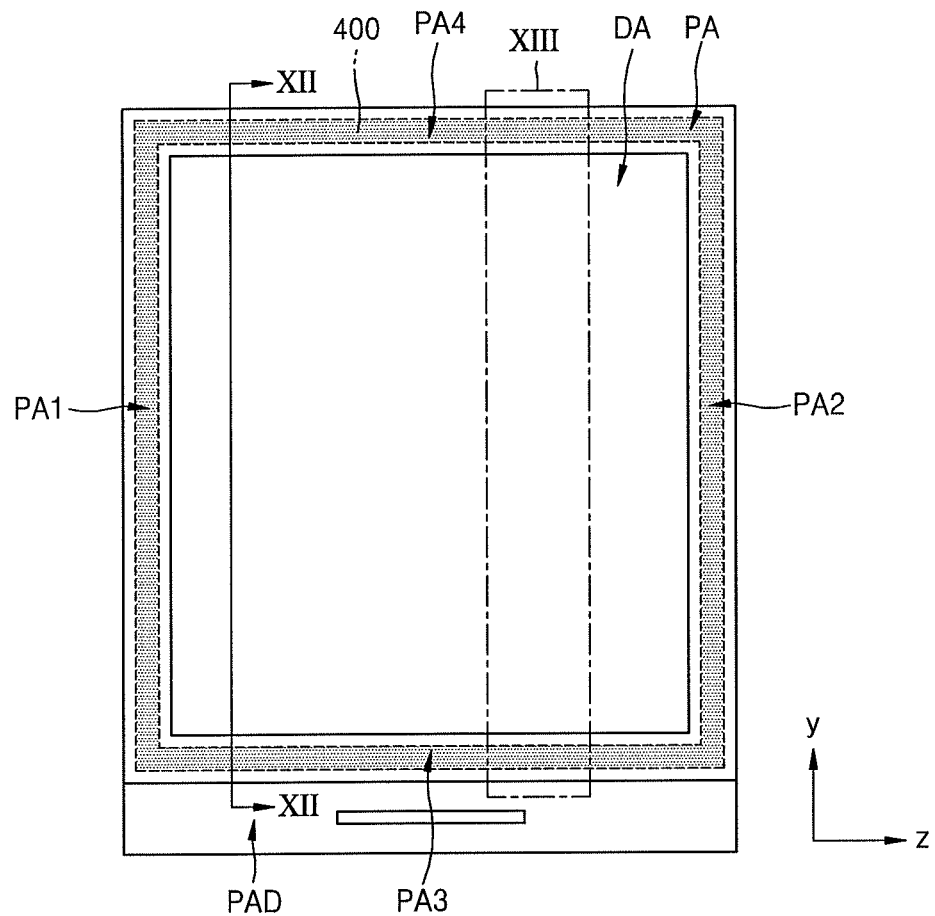
FIG. 11 illustrates a top view of an organic light-emitting display apparatus according to an embodiment.
Figure 12:
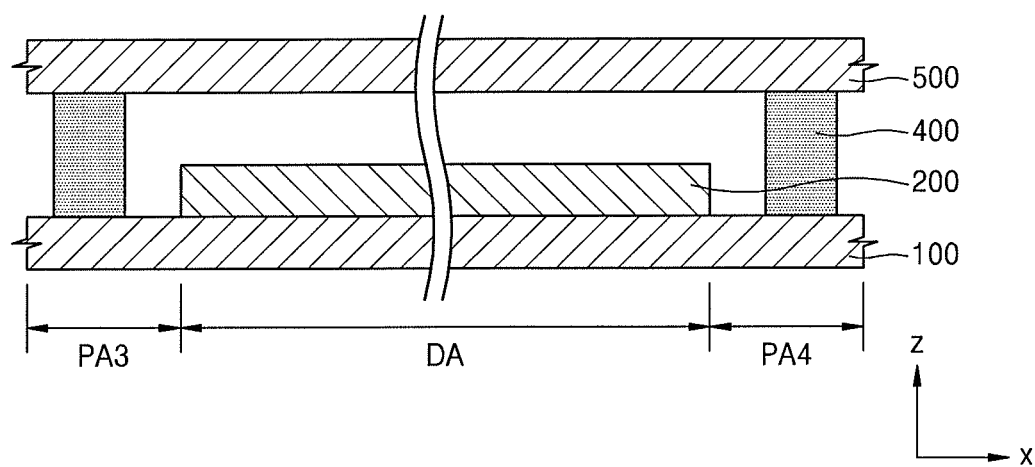
FIG. 12 illustrates a cross-sectional view of the organic light-emitting display apparatus of FIG. 11 along line XII-XII.
Figure 13:
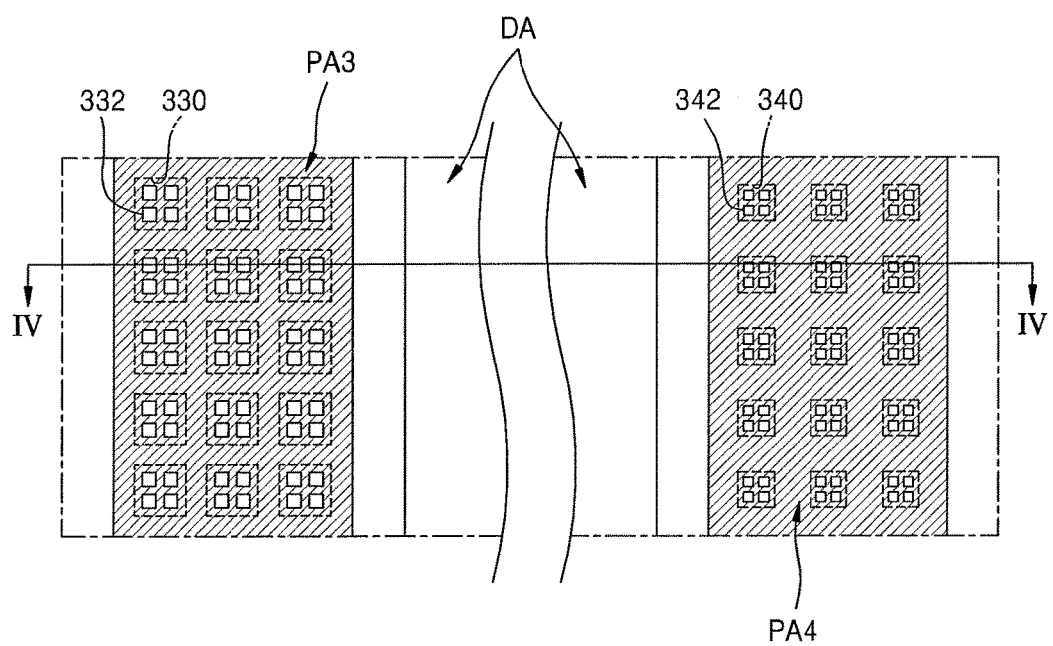
FIG. 13 illustrates a magnified top view of a portion where a sealing member is formed in a part XIII of FIG. 11.
Figure 14:
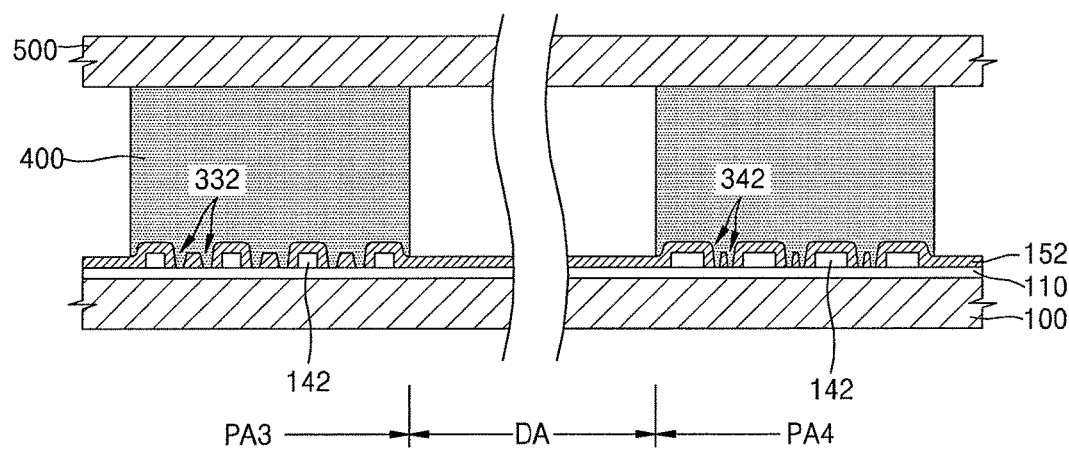
FIG. 14 illustrates a cross-sectional view of the organic light-emitting display apparatus of FIG. 13 along line IV-IV.

FIG. 11 illustrates a top view of an organic light-emitting display apparatus according to an embodiment, FIG. 12 illustrates a cross-sectional view of the organic light-emitting display apparatus of FIG. 11 along line XII-XII, FIG. 13 illustrates a magnified top view of a portion where a sealing member 400 is formed in the organic light-emitting display apparatus of FIG. 12, and FIG. 14 illustrates a cross-sectional view of a material layer formed below the sealing member 400 of the organic light-emitting display apparatus of FIG. 13.

Referring to FIGS. 11 to 14, the organic light-emitting display apparatus according to an embodiment may include a lower substrate 100, a first material layer 142 and a second material layer 152 disposed on the lower substrate 100 and partially patterned, a display unit 200, the sealing member 400, and an upper substrate 500.

Referring to FIGS. 11 and 12, the lower substrate 100 may have a display area DA in which a plurality of pixels may be arranged and a peripheral area PA surrounding the display area DA. The peripheral area PA of the lower substrate 100 may include a first peripheral part PA1, a second peripheral part PA2, a third peripheral part PA3, a fourth peripheral part PA4, and a pad part PAD. As shown in FIG. 11, the second peripheral part PA2 may be arranged symmetrically with the first peripheral part PA1, and the fourth peripheral part PA4 may be arranged symmetrically with the third peripheral part PA3. In an embodiment, for example, the first to fourth peripheral parts PA1 to PA4 may be arranged in a counterclockwise direction in an order of the first peripheral part PA1, the third peripheral part PA3, the second peripheral part PA2, and the fourth peripheral part PA4. An arrangement relationship of the first to fourth peripheral parts PA1 to PA4 may be associated with an order of forming the sealing member 400 to be described in detail below.

The sealing member 400 may be arranged between the lower substrate 100 and the upper substrate 500. The sealing member 400 may be arranged on the lower substrate 100 in the peripheral area PA. The upper substrate 500 may be bonded and sealed to the lower substrate 100 through the sealing member 400. For example, the sealing member 400 may be formed of, for example, frit or epoxy. The display unit 200 may be arranged in the display area DA and may include a plurality of pixels. For example, the display area DA may indicate an organic light-emitting display unit including a plurality of thin-film transistors and pixel electrodes connected to the plurality of thin-film transistors. A detailed structure of the display unit 200 will be described in detail below with reference to FIG. 14.

Referring to FIGS. 13 and 14, the barrier layer 110 and the first material layer 142 may be arranged all over the surface of the lower substrate 100, and third and fourth opening patterns 330 and 340 may be disposed in the first material layer 142 on the lower substrate 100 in the peripheral area PA. FIG. 13 shows an exemplary embodiment in which the third and fourth opening patterns 330 and 340 have a quadrilateral shape.

For example, the first material layer 142 located at the third peripheral part PA3 of the peripheral area PA may include the third opening pattern 330, and the first material layer 142 located at the fourth peripheral part PA4 of the peripheral area PA may include the fourth opening pattern 340. A size of the fourth opening pattern 340 may be smaller than a size of the third opening pattern 330. The third and fourth opening patterns 330 and 340 may be formed plural in number in the peripheral area PA. A portion of the barrier layer 110 disposed below the first material layer 142 may be exposed to the outside, for example, due to the third and fourth opening patterns 330 and 340. As used herein, size may refer to an area in plan view, as seen, for example, in FIG. 13, and/or may refer to a cross-sectional area, as seen, for example, in FIG. 14.

The size difference between the third and fourth opening patterns 330 and 340 may be determined by a forming order of the sealing member 400. For example, when the sealing member 400 at the third peripheral part PA3 at which the third opening pattern 330 is located is first formed, the size of the third opening pattern 330 may be larger than the size of the fourth opening pattern 340. The size of the third opening pattern 330 located at the third peripheral part PA3 at which the sealing member 400 is first formed may be formed larger, and the size of the fourth opening pattern 340 located at the fourth peripheral part PA4 at which the sealing member 400 is relatively later formed may be formed smaller.

It will be understood that this may be caused by a forming method in a process of manufacturing the sealing member 400. For example, the sealing member 400 may be formed in a clockwise or counterclockwise direction on the lower substrate 100 or below the upper substrate 500 in the peripheral area PA, wherein a portion where the sealing member 400 is first formed may be formed higher. A height difference between a start portion and an end portion of the sealing member 400 according to an order of forming the sealing member 400 may be adjusted by disposing the third opening pattern 330 at a portion where the sealing member 400 is first formed, i.e., at the third peripheral part PA3 in the present embodiment, when the sealing member 400 is formed.

The second material layer 152 formed on the lower substrate 100 in the peripheral area PA may include third and fourth through-holes 332 and 342. FIG. 13 shows an exemplary embodiment in which the third and fourth through-holes 332 and 342 have a quadrilateral shape.

For example, the second material layer 152 located at the third peripheral part PA3 of the peripheral area PA may include the third through-hole 332, and the second material layer 152 located at the fourth peripheral part PA4 of the peripheral area PA may include the fourth through-hole 342. A size of the fourth through-hole 342 may also be smaller than a size of the third through-hole 332, and the size of the fourth opening pattern 340 may be smaller than the size of the third opening pattern 330.

The third through-hole 332 may be located in the third opening pattern 330, and the fourth through-hole 342 may be located in the fourth opening pattern 340. A portion of the barrier layer 110 may be exposed through the third and fourth through-holes 332 and 342. The third and fourth through-holes 332 and 342 may each include a plurality of through-holes, wherein a plurality of third through-holes 332 may be formed in the third opening pattern 330, and a plurality of fourth through-holes 342 may be formed in the fourth opening pattern 340.

Through the third and fourth through-holes 332 and 342, a portion of the barrier layer 110 disposed below the first material layer 142 and the second material layer 152 may be exposed to the outside. For example, the second material layer 152 may be disposed to cover the first material layer 142. The second material layer 152 may be disposed to cover at least a portion of the third and fourth opening patterns 330 and 340 formed in the first material layer 142. For example, the second material layer 152 may have the third and fourth through-holes 332 and 342 in the third and fourth opening patterns 330 and 340, respectively, and a portion of the barrier layer 110 disposed below the first material layer 142 and the second material layer 152 may be exposed to the outside through the third and fourth through-holes 332 and 342.

The sealing member 400 may be disposed on the second material layer 152 such that the sealing member 400 fills in the third and fourth through-holes 332 and 342. The surface areas of the third and fourth through-holes 332 and 342 disposed in the third and fourth opening patterns 330 and 340 may increase in a depth direction so that the sealing member 400 is stably attached to the lower substrate 100. The sealing member 400 may directly contact the barrier layer 110 through the third and fourth through-holes 332 and 342.

As described above, the organic light-emitting display apparatus according to an embodiment may have a structure in which the first material layer 142 disposed at the third peripheral part PA3 may have the third opening pattern 330 and the second material layer 152 disposed on the first material layer 142 may have one or more third through-holes 332 in the third opening pattern 330. It may be understood with reference to FIG. 13 that a structure having one or more third through-holes 332 in the third opening pattern 330 may have a one-box structure.

The organic light-emitting display apparatus according to an embodiment may have a structure in which the first material layer 142 disposed at the fourth peripheral part PA4 arranged symmetrically with the third peripheral part PA3 may have the fourth opening pattern 340 and the second material layer 152 disposed on the first material layer 142 may have one or more froth through-holes 342 in the fourth opening pattern 340. The size of the fourth opening pattern 340 may be smaller than the size of the third opening pattern 330, and likewise, the size of the fourth through-hole 342 may be smaller than the size of the third through-hole 332.

The third peripheral part PA3 and the fourth peripheral part PA4 may be symmetrically arranged based on the display area DA in terms of one display panel, and the fourth peripheral part PA4 of one display panel may be adjacent to the third peripheral part PA3 of another display panel which may share a long side with the one display panel in a manufacturing process. When the sealing member 400 is formed in the one display panel in one direction, a height difference may occur between a start portion and an end portion of the sealing member 400, and a stress according to formation and contraction of the sealing member 400 may occur between the lower substrate 100 and the upper substrate 500 of adjacent display panels. In the organic light-emitting display apparatus according to an embodiment, the sizes of the third opening pattern 330 and the third through-hole 332 disposed at the third peripheral part PA3 may be larger than the sizes of the fourth opening pattern 340 and the fourth through-hole 342 disposed at the fourth peripheral part PA4. When the sealing member 400 is formed in a counterclockwise direction by starting from the third peripheral part PA3, a height of the sealing member 400 may be high at the third peripheral part PA3 where the sealing member 400 is first formed and contracted, and a stress of the lower substrate 100 and the upper substrate 500, for example, due to a height difference of the sealing member 400 between adjacent display panels, may be minimized by forming the sizes of the third opening pattern 330 and the third through-hole 332 disposed at the third peripheral part PA3 to be larger than the sizes of the fourth opening pattern 340 and the fourth through-hole 342 disposed at the fourth peripheral part PA4.

As shown in FIG. 11, the peripheral area PA of the lower substrate 100 may further include the third peripheral part PA3 and the fourth peripheral part PA4 connecting the first peripheral part PA1 and the second peripheral part PA2. It may be understood that the first to fourth peripheral parts PA1 to PA4 may be arranged along and correspond to the sides of the peripheral area PA of the lower substrate 100 formed in an almost rectangular shape. The first peripheral part PA1 may be arranged symmetrically with the second peripheral part PA2, and the third peripheral part PA3 may be arranged symmetrically with the fourth peripheral part PA4. For example, the first to fourth peripheral parts PA1 to PA4 may be arranged in a counterclockwise direction in an order of the first peripheral part PA1, the third peripheral part PA3, the second peripheral part PA2, and the fourth peripheral part PA4.

Referring back to FIG. 14, the sealing member 400 may be interposed between the lower substrate 100 and the upper substrate 500. By the sealing member 400, the lower substrate 100 and the upper substrate 500 may be bonded, and the display unit disposed on the lower substrate 100 in the display area DA may be sealed and protected from the outside. To firmly bond the upper substrate 500 and the lower substrate 100 by means of the sealing member 400, the first opening pattern, the third opening pattern 330, the second opening pattern, and the fourth opening pattern 340 may be arranged in the first material layer 142 disposed on the lower substrate 100 in the peripheral area PA, and the first through-hole, the third through-hole 332, the second through-hole, and the fourth through-hole 342 may be arranged in the second material layer 152 disposed on the lower substrate 100 in the peripheral area PA. A contact area between the lower substrate 100 and the sealing member 400 may be wide, for example, due to these opening patterns and through-holes, and a bonding force between the lower substrate 100 and the sealing member 400 may be improved.

By way of summation and review, an organic light-emitting display apparatus may have thin-film transistors and organic light-emitting devices (OLEDs) on a substrate and may operate as the OLEDs emit light by themselves. The organic light-emitting display apparatus may be used as a display unit of a miniaturized product such as, for example, a cellular phone, or may be used as a display unit of a large-sized product such as, for example, a TV.

For the organic light-emitting display apparatus, a plurality of display units may be formed on a base substrate, and a sealing member for sealing each of the plurality of display units may be formed on an upper substrate. Individual display apparatuses may be formed by bonding the base substrate and the upper substrate and cutting each cell in which a corresponding display unit is formed.

In this regard, a stress may occur between adjacent cells of a base substrate during cell cutting, for example, due to a height and contraction rate difference of a sealing member according to a forming order of the sealing member.

As described above, according to the one or more of the above exemplary embodiments, an organic light-emitting display apparatus in which the occurrence of a defect may be minimized during cell cutting, and a method of manufacturing the same may be implemented.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
    a lower substrate having a peripheral area, which includes a first peripheral part extending from one edge of the lower substrate to a display area and a second peripheral part extending from another edge of the lower substrate to the display area, the display area being between the first peripheral part and the second peripheral part;
    an upper substrate on the lower substrate;
    a sealing member between the lower substrate and the upper substrate and on the lower substrate in the peripheral area; and
    a first material layer between the sealing member and the lower substrate and including a first opening pattern only at the first peripheral part and not at the second peripheral part and a second opening pattern only at the second peripheral part and not at the first peripheral part, the second opening pattern having a smaller size than the first opening pattern such that each opening in the first material layer at the second peripheral part is smaller than each opening in the first material layer at the first peripheral part such that the first opening pattern and the second opening pattern are asymmetrically arranged about an axis bisecting the display area.

2. The organic light-emitting display apparatus as claimed in claim 1, further comprising a second material layer having:
    a first through-hole between the sealing member and the first material layer and at the first peripheral part; and
    a second through-hole at the second peripheral part, the second through-hole having a smaller size than the first through-hole.

3. The organic light-emitting display apparatus as claimed in claim 2, wherein:
    the first through-hole is in the first opening pattern, and
    the second through-hole is in the second opening pattern.

4. The organic light-emitting display apparatus as claimed in claim 3, wherein:
    a plurality of first through-holes is in the first opening pattern, and
    a plurality of second through-holes is in the second opening pattern.

5. The organic light-emitting display apparatus as claimed in claim 2, wherein:
    the peripheral area further includes a third peripheral part and a fourth peripheral part outside the display area and connecting the first peripheral part and the second peripheral part, and
    the first material layer further includes a third opening pattern at the third peripheral part and a fourth opening pattern at the fourth peripheral part, the fourth opening pattern having a smaller size than the third opening pattern.

6. The organic light-emitting display apparatus as claimed in claim 5, wherein the second material layer further includes a third through-hole at the third peripheral part and a fourth through-hole at the fourth peripheral part, the fourth through-hole having a smaller size than the third through-hole.

7. The organic light-emitting display apparatus as claimed in claim 6, wherein:
    the third through-hole is in the third opening pattern, and
    the fourth through-hole is in the fourth opening pattern.

8. The organic light-emitting display apparatus as claimed in claim 7, wherein:
    a plurality of third through-holes is in the third opening pattern, and
    a plurality of fourth through-holes is in the fourth opening pattern.

9. The organic light-emitting display apparatus as claimed in claim 8, wherein the third opening pattern is smaller than the first opening pattern and larger than the second opening pattern.

10. The organic light-emitting display apparatus as claimed in claim 2, further comprising a barrier layer between the lower substrate and the first material layer,
    wherein at least a portion of the barrier layer is exposed through the first through-hole and the second through-hole.

11. The organic light-emitting display apparatus as claimed in claim 10, wherein the sealing member directly contacts the barrier layer through the first through-hole and the second through-hole.

12. The organic light-emitting display apparatus as claimed in claim 2, wherein:
    the first material layer includes a metallic material, and
    the second material layer includes an organic or inorganic material.

13. The organic light-emitting display apparatus as claimed in claim 1, wherein:
    each opening in the first material layer at the first peripheral part has a same size, and
    each opening in the first material layer at the second peripheral part has a same size.

14. An organic light-emitting display apparatus, comprising:
    a lower substrate having a display area and a peripheral area around the display area, the peripheral area extending from an edge of the lower substrate to the display area;
    an upper substrate on the lower substrate;
    a sealing member between the lower substrate and the upper substrate and on the lower substrate in the peripheral area;

a first material layer between the sealing member and the lower substrate and including an opening pattern; and a second material layer between the sealing member and the first material layer and including a plurality of through-holes in the opening pattern, wherein the opening pattern and the plurality of through-holes are gradually smaller in a clockwise or counterclockwise direction along the peripheral area, each opening in the first material layer along one side of the apparatus having a size that is different from each opening in the first material layer along a side of the apparatus that is adjacent to the one side such that the opening pattern and the plurality of through-holes are asymmetrically arranged about an axis bisecting the display area.

15. A method of manufacturing an organic light-emitting display apparatus, the method comprising:

preparing a lower mother substrate having a plurality of panels, each panel having a peripheral area including a first peripheral part extending from one edge of the lower substrate to a display area and a second peripheral part extending from another edge of the lower substrate to the display area, the display area being between the first peripheral part and the second peripheral part;

forming a first material layer on the lower mother substrate;

forming a first opening pattern in the first material layer only at the first peripheral part and not at the second peripheral part and forming a second opening pattern in the first material layer only at the second peripheral part and not at the first peripheral part, the second opening pattern having a smaller size than the first opening pattern and each opening in the first material layer at the second peripheral part being smaller than each opening in the first material layer at the first peripheral part such that the first opening pattern and the second opening pattern are asymmetrically arranged about an axis bisecting the display area;

forming a display unit including an organic light-emitting device (OLED) in the display area;

forming a sealing member in the peripheral area, forming the sealing member including forming the sealing member at the first peripheral part and thereafter forming the sealing member at the second peripheral part;

bonding the lower mother substrate and an upper mother substrate with the sealing member therebetween; and cutting the plurality of panels along a cutting line between the plurality of panels.

16. The method as claimed in claim 15, wherein forming the sealing member includes forming the sealing member in a clockwise or counterclockwise direction.

17. The method as claimed in claim 15, further comprising forming a second material layer after forming the first material layer and before forming the sealing member, wherein forming the second material layer includes forming a first through-hole in the second material layer at the first peripheral part and forming a second through-hole in the second material layer at the second peripheral part such that the second through-hole has a smaller size then the first through-hole.

18. The method as claimed in claim 17, wherein forming the second material layer includes forming the first through-hole in the first opening pattern and forming the second through-hole in the second opening pattern.

19. The method as claimed in claim 17, wherein:

a plurality of first through-holes is formed in the first opening pattern, and a plurality of second through-holes is formed in the second opening pattern.

20. The method as claimed in claim 17, further comprising forming a barrier layer after preparing the lower mother substrate and before forming the first material layer, wherein the sealing member directly contacts at least a portion of the barrier layer through the first through-hole and the second through-hole.

* * * * *